(12) United States Patent
Hatch

(10) Patent No.: US 8,936,495 B2
(45) Date of Patent: Jan. 20, 2015

(54) DUAL CONTACT POGO PIN ASSEMBLY

(71) Applicant: Honeywell Federal Manufacturing & Technologies, LLC, Kansas City, MO (US)

(72) Inventor: Stephen McGarry Hatch, Blue Springs, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 160 days.

(21) Appl. No.: 13/736,668

(22) Filed: Jan. 8, 2013

(65) Prior Publication Data
US 2014/0194011 A1   Jul. 10, 2014

(51) Int. Cl.
*H01R 13/24* (2006.01)
*H01R 13/514* (2006.01)
*G01R 1/04* (2006.01)
*G01R 27/02* (2006.01)

(52) U.S. Cl.
CPC .......... *H01R 13/2421* (2013.01); *H01R 13/514* (2013.01); *G01R 1/0416* (2013.01); *H01R 2201/20* (2013.01); *G01R 27/02* (2013.01)
USPC ........................................................ 439/700

(58) Field of Classification Search
CPC ........... H01R 13/2421; H01R 13/2428; H01R 23/722; H01R 33/46; H01R 2201/20
USPC ................. 439/700; 324/754, 754.11, 755.11
See application file for complete search history.

(56) References Cited

U.S. PATENT DOCUMENTS

| 4,531,799 | A  | * | 7/1985  | Gray ............................. 439/298 |
| 4,684,193 | A  |   | 8/1987  | Havel |
| 4,897,045 | A  |   | 1/1990  | Dyck |
| 5,645,433 | A  | * | 7/1997  | Johnson ......................... 439/66 |
| 5,993,269 | A  | * | 11/1999 | Ito ................................ 439/824 |
| 6,257,911 | B1 |   | 7/2001  | Shelby et al. |
| 6,321,103 | B1 | * | 11/2001 | Dowd et al. .................... 600/376 |
| 6,648,654 | B1 | * | 11/2003 | Akram et al. .................... 439/70 |
| 6,655,983 | B1 | * | 12/2003 | Ishikawa et al. ............... 439/482 |
| 6,677,772 | B1 | * | 1/2004  | Faull .......................... 324/755.05 |
| 6,917,525 | B2 | * | 7/2005  | Mok et al. ...................... 361/767 |
| 6,939,175 | B2 | * | 9/2005  | Parrish et al. ............ 439/620.03 |
| 7,056,128 | B2 | * | 6/2006  | Driscoll et al. ................. 439/65 |
| 7,214,072 | B1 | * | 5/2007  | Hayashi et al. ................. 439/73 |
| 7,271,606 | B1 |   | 9/2007  | Tang et al. |

(Continued)

FOREIGN PATENT DOCUMENTS

CN         2351886        12/1999

*Primary Examiner* — Abdullah Riyami
*Assistant Examiner* — Vladimir Imas
(74) *Attorney, Agent, or Firm* — Hovey Williams LLP

(57) ABSTRACT

A contact assembly includes a base and a pair of electrical contacts supported by the base. A first end of the first electrical contact corresponds to a first end of the base and is configured to engage a first external conductive circuit element. A first end of the second electrical contact also corresponds to the first end of the base and is configured to engage a second external conductive circuit element. The first contact and the second contact are electrically isolated from one another and configured to compress when engaging an external connector element. The base includes an aperture positioned on a second end of the base outboard of a second end of the first and second electrical contacts. The aperture presents a narrowing shape with a wide mouth distal the electrical contacts and a narrow internal through-hole proximate the electrical contacts.

19 Claims, 6 Drawing Sheets

(56) References Cited

U.S. PATENT DOCUMENTS

| | | | |
|---|---|---|---|
| 7,429,188 B2* | 9/2008 | Wu | 439/490 |
| 7,713,095 B2* | 5/2010 | Yodogawa | 439/700 |
| 7,736,156 B2* | 6/2010 | Ko | 439/76.1 |
| 7,815,474 B1* | 10/2010 | Lin et al. | 439/700 |
| 7,922,544 B2* | 4/2011 | Chung | 439/700 |
| 7,942,705 B2* | 5/2011 | Murphy et al. | 439/668 |
| 8,253,433 B2* | 8/2012 | Washio et al. | 324/762.01 |
| 8,277,231 B2* | 10/2012 | Christ et al. | 439/66 |
| 8,337,256 B1* | 12/2012 | Lin | 439/700 |
| 8,344,747 B2* | 1/2013 | Kazama et al. | 324/755.01 |
| 8,445,295 B2* | 5/2013 | Shibuya et al. | 438/14 |
| 8,525,539 B2* | 9/2013 | Washio et al. | 324/756.05 |
| 8,710,858 B2* | 4/2014 | Detofsky et al. | 324/756.01 |
| 8,723,540 B2* | 5/2014 | Yamamoto et al. | 324/754.11 |
| 8,723,542 B2* | 5/2014 | Lin | 324/755.05 |
| 8,727,328 B2* | 5/2014 | Lee | 269/289 R |
| 2011/0025358 A1* | 2/2011 | Kazama et al. | 324/755.01 |
| 2012/0182036 A1* | 7/2012 | Yamamoto et al. | 324/754.11 |

\* cited by examiner

DUAL CONTACT POGO PIN ASSEMBLY

GOVERNMENT INTERESTS

The present invention was developed with support from the U.S. government under a contract with the United States Department of Energy, Contract No. DE-NA0000622. Accordingly, the U.S. government has certain rights in the present invention.

BACKGROUND

1. Field

Embodiments of the present invention relate to electrical connectors. More particularly, embodiments of the present invention relate to dual contact electrical connectors configured to minimize physical damage associated with repeated use.

2. Related Art

Four-wire sensing is a technique used to measure electrical impedance in a circuit under test. Four-wire sensing involves using two sets of wires to take measurements rather than a single set of wires. A first pair of wires, sometimes referred to as the "force" wires, supplies current to the circuit under test. A second pair of wires, also referred to as the "sense" wires, is connected to the circuit under test and used to measure impedance in the circuit. Four-wire impedance testing is typically more accurate than two-wire impedance testing because very little or no current flows through the sense wires, thereby reducing or eliminating the voltage drop across the sense wires that may adversely affect the accuracy of the measurement.

Kelvin type connectors may be used with four-wire sensing circuits. Kelvin type connectors include two electrical contacts integrated into a single connector housing and configured to contact a single, external conductive element at two different points, thus eliminating the need for two separate connectors attached to the conductive element. Because each Kelvin type connector includes two contacts, a single pair of Kelvin type connectors can be used to complete a four-wire sensing circuit. Kelvin type connectors are especially useful in applications that require four-wire sensing circuits (or other circuits that involve two sets of wires) to be repeatedly and frequently connected and disconnected. One example of this type of application is circuit manufacturing and/or testing processes, where four-wire sensing circuits may be connected and disconnected from circuits under test hundreds or even thousands of times each day.

Unfortunately, the repeated and frequent use of electrical connectors may damage the connectors over time. Such damage may occur in elements of the connectors that frequently contact other elements, such as electrical contacts that engage and rub against other electrical contacts as connections are made and as connectors are separated. By way of example, such frequent contact may occur where a first connector slides into friction-fit engagement with another connector each time a connection is made and slides out of friction-fit engagement each time the components are separated.

SUMMARY

Embodiments of the present invention solve the above-described problems by providing an electrical connector including dual-contact assemblies with spring-biased electrical contacts configured to engage connector elements, such as connector pins, while minimizing damage to the electrical contacts resulting from rubbing against the connector elements.

A contact assembly in accordance with an embodiment of the invention comprises a base, a first electrical contact and a second electrical contact. The base is formed at least partially of an electrically nonconductive material and supports the first and second electrical contacts. A first end of the first electrical contact corresponding to a first end of the base is configured to engage a first external conductive circuit element. A first end of the second electrical contact corresponding to the first end of the base is configured to engage a second external conductive circuit element.

The first contact and the second contact are electrically isolated from one another, and each contact is configured to compress when engaging an external connector element. The base includes an aperture positioned on a second end of the base outboard of a second end of the electrical contacts, the aperture presenting a narrowing shape with a wide mouth distal the electrical contacts and a narrow internal through-hole proximate the electrical contacts.

A connector in accordance with another embodiment of the invention comprises a circuit board, a housing secured to the circuit board, and a plurality of contact assemblies each disposed within the housing. The circuit board includes a plurality of conductive pads arranged in pairs, each pair of pads comprising a first conductive pad and a second conductive pad. Each of the contact assemblies is positioned in an aperture of the housing, is configured to shift within the housing, and is configured to engage one of the pairs of conductive pads.

Each of the contact assemblies includes a base formed at least partially of an electrically nonconductive material, a first electrical contact supported by the base and configured to engage a first conductive pad, and a second electrical contact supported by the base and configured to engage a second conductive pad. The first contact and the second contact are electrically isolated from one another and configured to compress when engaging an external connector element. The base includes an aperture positioned on an end of the base opposite the circuit board, the aperture being positioned outboard of the first and second electrical contacts and presenting a narrowing shape with a wide mouth distal the electrical contacts and a narrow internal through-hole proximate the electrical contacts.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the preferred embodiments and the accompanying drawing figures.

Figure 1:
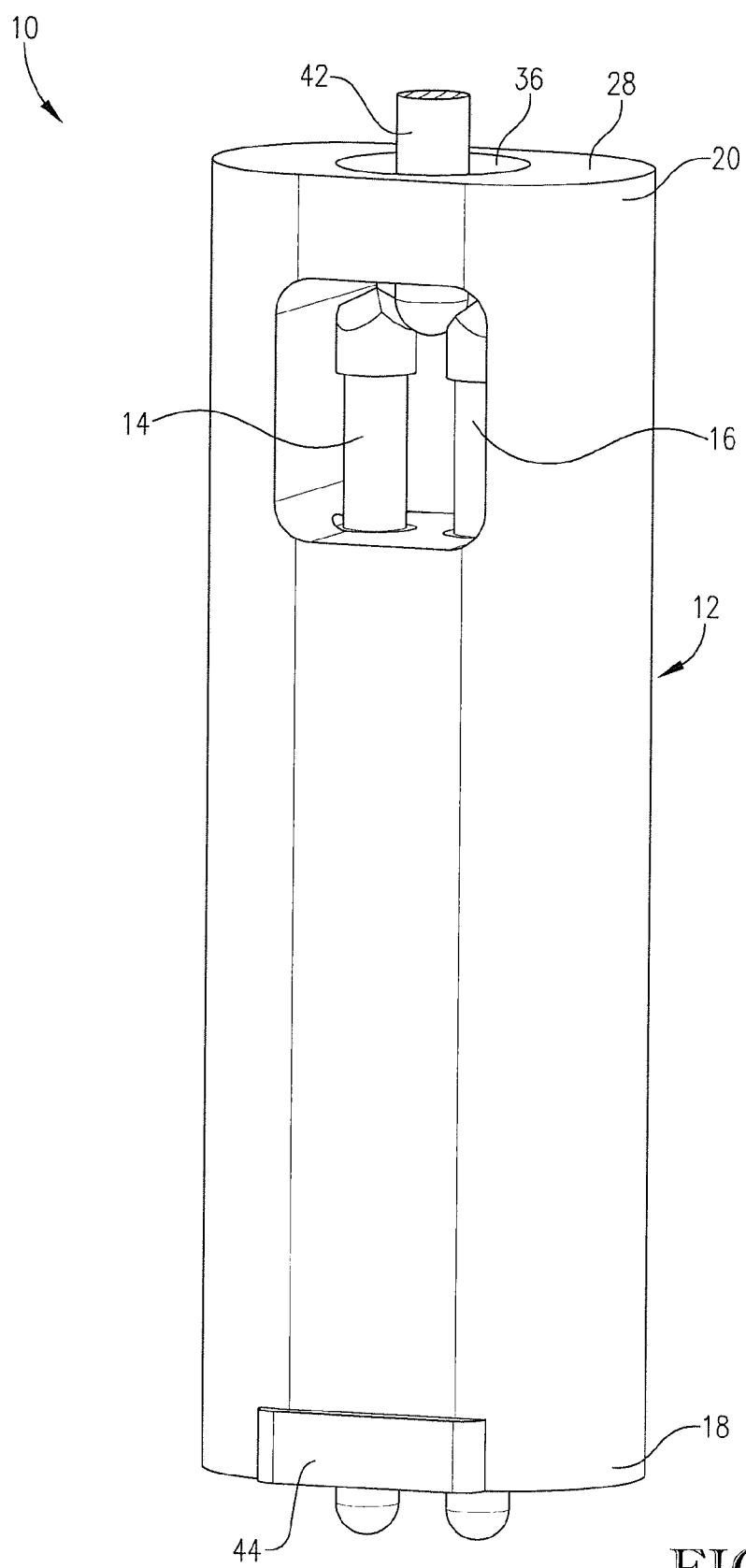
FIG. 1 is a top perspective view of a dual-contact assembly constructed in accordance with embodiments of the invention.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention may be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Figure 2:
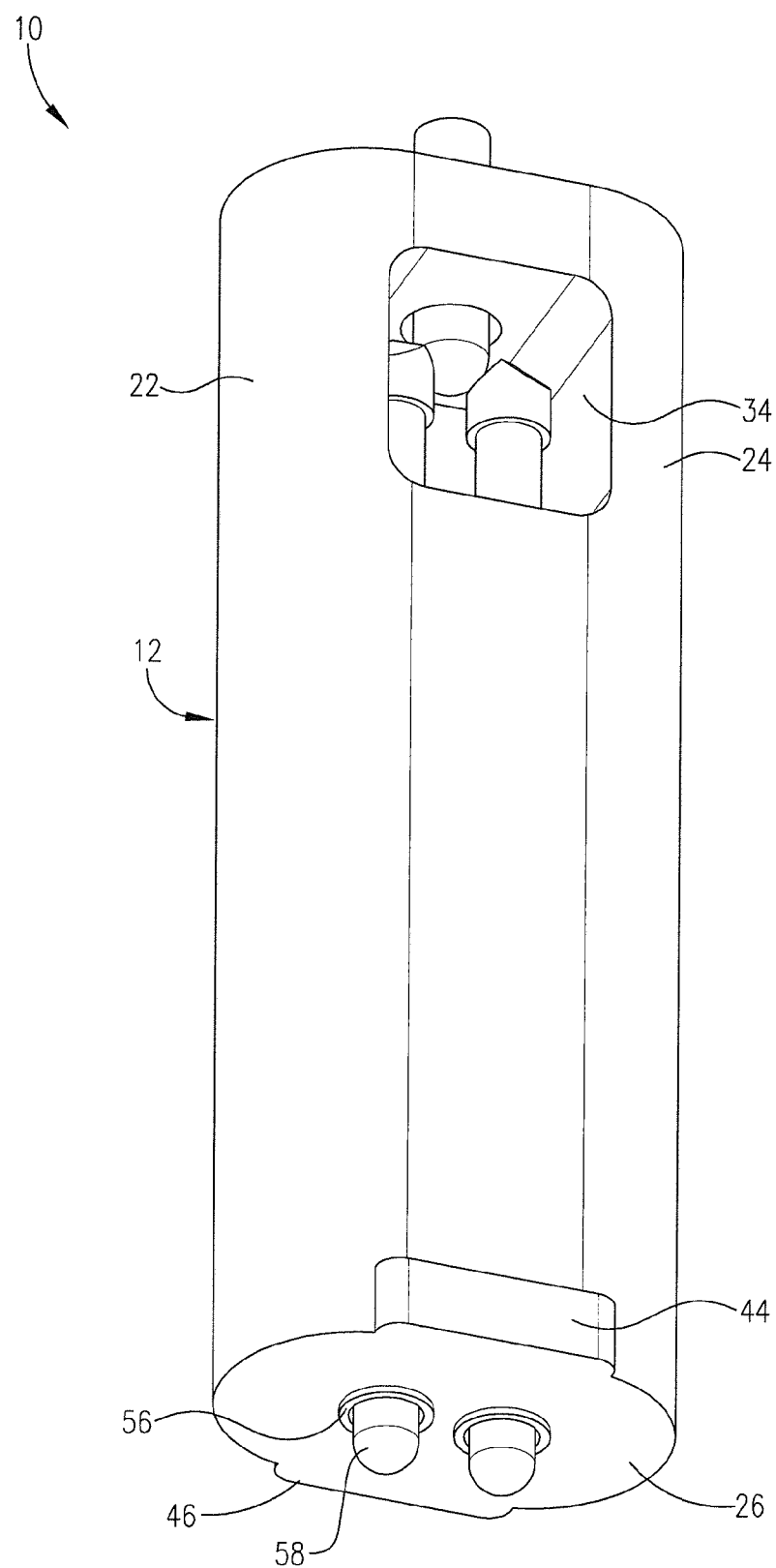
FIG. 2 is a bottom perspective view of the dual-contact assembly of FIG. 1.
Figure 3:
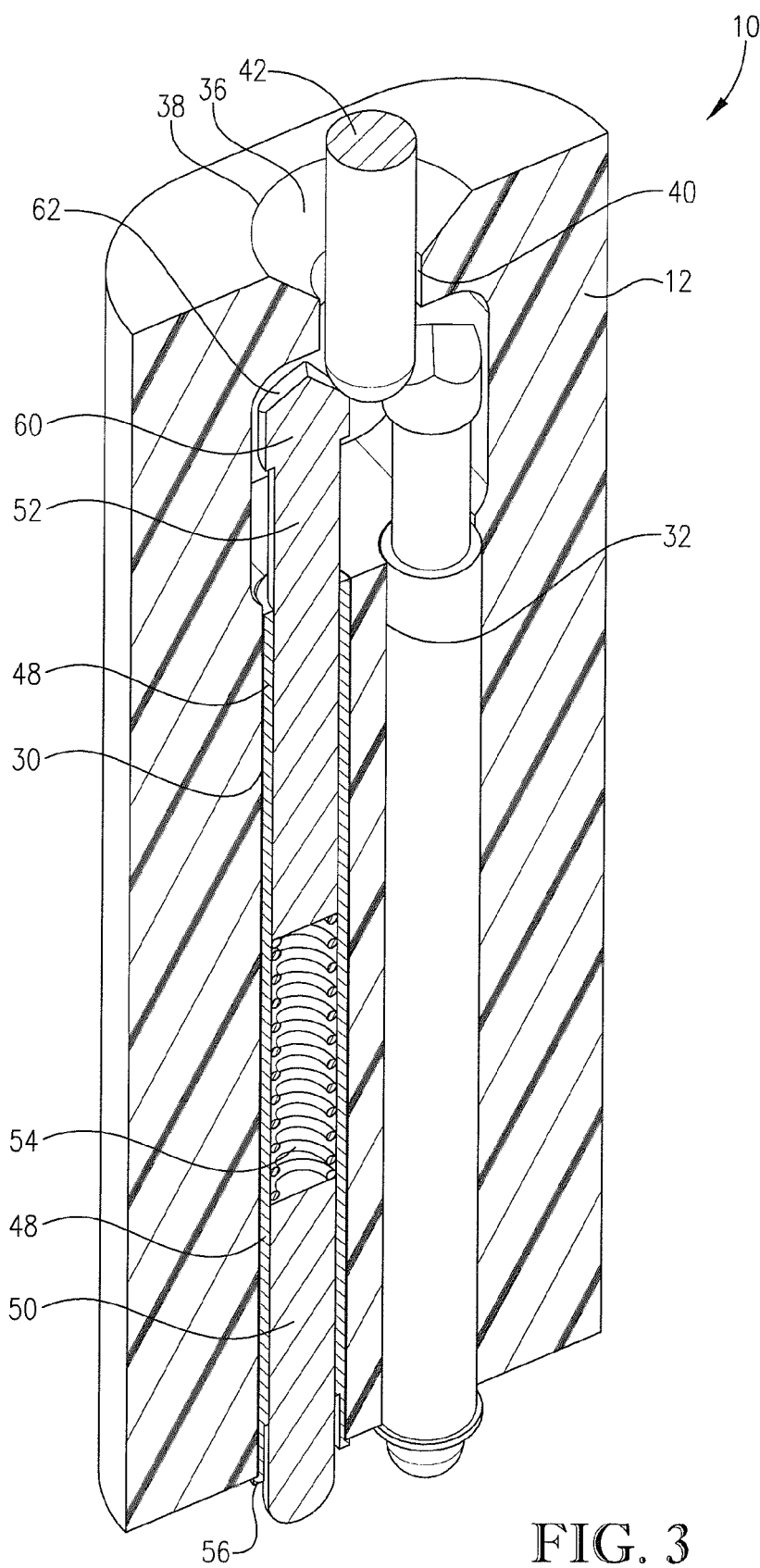
FIG. 3 is a cross-sectional view of the dual-contact assembly of FIG. 1.

Referring now to the drawings, wherein like reference numerals designate identical or corresponding parts throughout the several views, a contact assembly 10 constructed in accordance with embodiments of the invention is illustrated in FIGS. 1-3. The contact assembly 10 broadly includes a base 12 and a pair of electrical contacts 14, 16 supported by the base 12. The base 12 supports the electrical contacts 14, 16 in a generally fixed relationship one with the other and is constructed at least in part of an electrically nonconductive material, such as plastic, such that each of the electrical contacts 14, 16 is electrically isolated from the other. The base 12 presents a generally elongated shape with a first end 18, a second end 20 and an oblong cross section with rounded edge portions 22, 24. Each of the first end 18 and the second end 20 presents a generally flat outer surface 26, 28.

A pair of parallel cylindrical boreholes 30, 32 extend from the first end 18 of the base to a contact opening 34 near the second end 20 of the base 12 and are configured to receive and support the electrical contacts 14, 16. A narrowing aperture 36 on the second end 20 of the base presents a wide mouth 38 distal the contact opening 34 and a round, funnel-shaped body leading to a narrow through-hole 40 that connects the aperture 36 with the contact opening 34. The narrowing aperture 36 is positioned outboard of the electrical contacts 14, 16, and a center of the aperture 36 is generally aligned with a portion of the base 12 that is between the boreholes 30, 32. In various embodiments, the center of the narrowing aperture 36 corresponds to the center of the base 12 and the boreholes 30, 32 are positioned on opposing sides of the center of the base 12.

The narrowing aperture 36 is configured to guide an external connector element 42, such as a connector pin, into engagement with the electrical contacts 14, 16 wherein the connector element 42 is generally parallel with the contacts and a center of the connector element 42 is positioned between the contacts. In this position the connector element 42 may engage both of the electrical contacts simultaneously. Thus, the narrowing aperture 36 may present a substantially conical shape, as illustrated, or may present a different narrowing configuration operable to guide the connector element 42 to the through-hole 40 and into alignment with the electrical contacts 14, 16.

The base 12 further includes a pair of retention tabs 44, 46 positioned proximate the first end 18 and on opposite sides of the base 12. The retention tabs 44, 46 are configured to engage corresponding retention recesses in a connector housing, as explained below, and to retain the base 12 in the housing.

The electrical contacts 14, 16 may be similarly or identically configured, therefore, electrical contact 14 will be described in detail with the understanding that contact 16 is similarly configured. The electrical contact 14 broadly includes a sleeve 48, a first contact segment 50, a second contact segment 52 and a spring element 54 interposed between the first segment 50 and the second segment 52. The sleeve 48 presents a cylindrical shape with an annular flange 56 at a first end thereof configured to engage the base 12 and maintain the sleeve 48 in a fixed position relative to the base 12. The sleeve 48 is fixedly secured in the borehole 30 and may extend from the first end 18 of the base to an inboard side of the contact opening 34. The sleeve 48 is constructed at least in part of an electrically conductive material, such as metal, and may provide a conductive path between the first 50 and second 52 segments.

The first contact segment 50 is proximate the first end 18 of the base, presents a cylindrical shape, and is slidably disposed in the sleeve 48 such that it may move in a longitudinal direction relative to the sleeve 48, retracting and extending during use of the contact assembly 10. An outboard end of the first contact segment extends beyond the first end 18 of the base 12 and presents a rounded tip 58. The first contact segment 50 is configured and positioned to engage an external circuit element (such as a circuit board pad), as explained below in greater detail. The rounded tip 58 is particularly useful because the segment 50 may engage the external circuit element at any of various angles and may pivot during use. An inboard end of the segment 50 engages the spring element 54.

The second contact segment 52 is proximate the second end 20 of the base 12, presents a cylindrical shape, and is slidably disposed in the sleeve 48 such that it may move in a longitudinal direction relative to the sleeve 48, retracting and extending during use of the contact assembly 10. A first end of the second contact segment 52 extends into the contact opening 34 and is configured to engage the external connector element 42. The first end includes a contact head 60 presenting a chamfered tip 62 with a plurality of surface faces each angled downwardly from a central point of the tip 62. The angle of each of the surface faces allows the tip 62 to contact the external connector element 42 at an angle that is substantially normal to a surface of the tip 62, even though the external connector element 42 is centered between the electrical contacts 14, 16 and is thus offset from each. A second end of the second contact segment 52 engages the spring element 54 opposite the first segment 50.

The spring element 54 is disposed within the sleeve 48 and positioned intermediate the first contact segment 50 and the second contact segment 52. The spring element 54 biases the first segment 50 and the second segment 52 away from one another and towards the ends of the base 12 such that the first segment 50 is positioned to contact the external circuit element and the second segment 52 is positioned to contact the contact element 42, yet either segment may move inward as the spring element 54 yields to pressure exerted on the segments 50, 52. The spring element 54 may be a compression spring, as illustrated, or other component configured to yieldably bias the segments 50, 52 away from one another. The spring element 54 is preferably made of a conductive material, such as metal, and may be fixedly connected to both segments 50, 52 or may be free-floating in the sleeve 48. The spring element 54 may be free-floating within the sleeve 48 or may be fixed in position by, for example, adhering a portion of the spring element 54 to the sleeve 48.

The electrical contacts 14, 16 are configured to provide an electrically conductive path between the tip 58 of the first segment 50 and the tip 62 of the second contact segment 52. The conductive path may comprise the contact segments 50 and 52 and the spring element 54 or may comprise the contact segments 50 and 52 and the sleeve 48. The conductive path may include both the sleeve 48 and the and the spring element 54. The electrically conductive path is preserved regardless of the position of each of the segments 50 and 52.

Because both segments 50, 52 of the electrical contact 14 are configured to retract inward into the sleeve 48 and extend outward from the sleeve 48 during operation, the contact assembly 10 may engage and disengage external connector elements repeatedly with little or no damage thereto. This is due to the spring-biased, rather than friction fit, functionality of the assembly 10. Furthermore, the spring-biased electrical contacts 14, 16 allow the entire contact assembly 10 to shift relative to external elements while retaining electrical continuity between the segments 50, 52.

Figure 4:
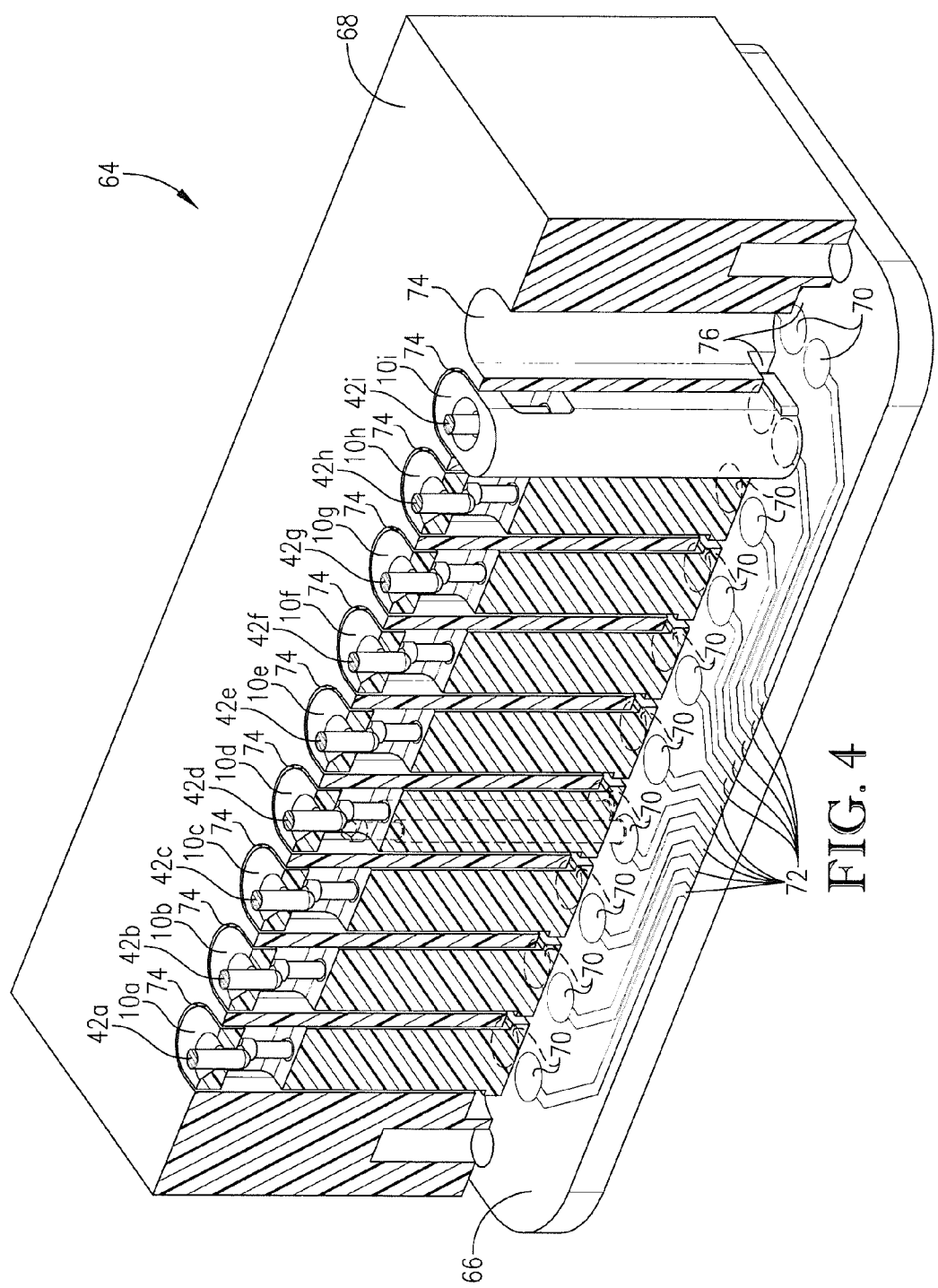
FIG. 4 is a first cross-sectional view of an electrical connector including a plurality of dual-contact assemblies similar to the assembly of FIG. 1.
Figure 5:
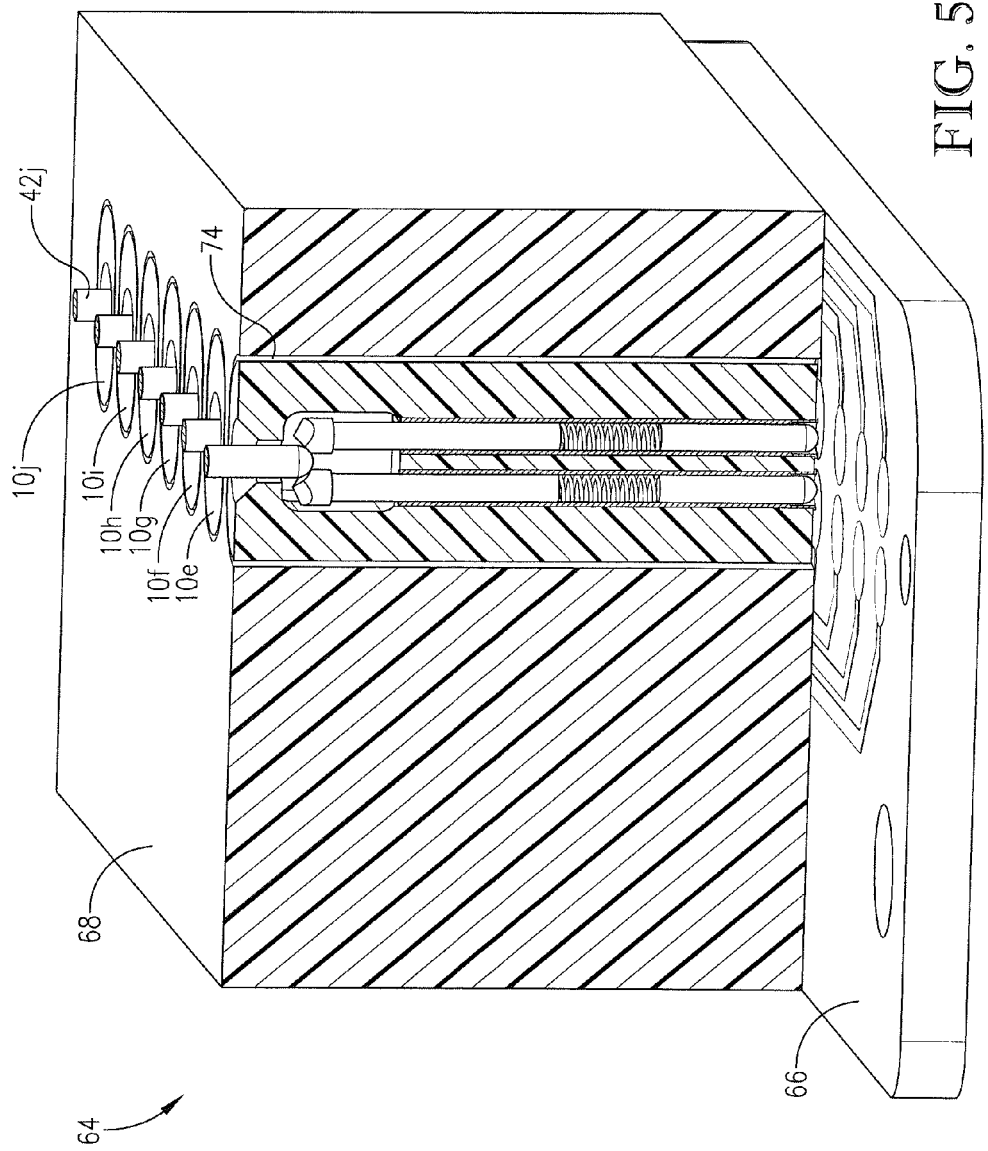
FIG. 5 is a second cross-sectional view of the connector of FIG. 4.
Figure 6:
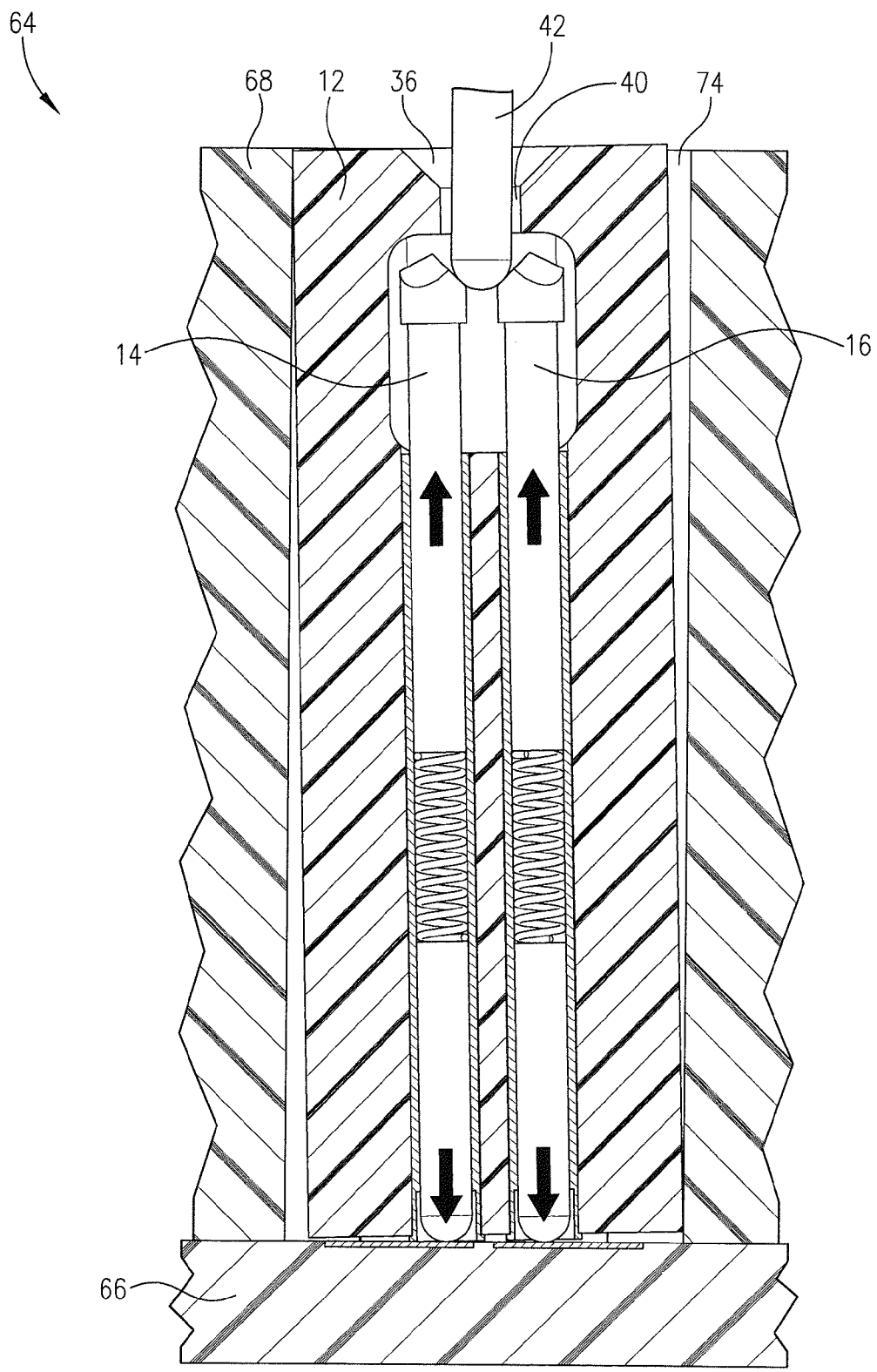
FIG. 6 is a fragmentary, enlarged cross-sectional view of a portion of the connector of FIG. 4 including one of the dual-contact assemblies.

Turning now to FIGS. 4-6, a connector 64 constructed in accordance with embodiments of the invention is illustrated. The connector 64 broadly includes a circuit board 66, a housing 68 mounted on the circuit board 66, and a plurality of contact assemblies 10a-j disposed in the housing 68. The circuit board 66 includes a plurality of conductive circuit elements 70, such as metal pads, arranged in pairs and positioned to engage the electrical contacts 14, 16 of the contact assemblies 10a-j. Each of the conductive circuit elements 70 is part of a larger circuit, as indicated by the conductive traces 72 associated with the circuit elements 70. By way of example, the larger circuit may include another connector or a test circuit, such as a four-wire sensing circuit.

The housing 68 is fixed to the circuit board 66 and includes a plurality of apertures 74 each configured to receive and retain one of the contact assemblies 10a-j. Each of the housing apertures 74 is aligned with one of the pairs of circuit elements 70 such that the electrical contacts 14, 16 of a contact assembly 10 mounted therein engage the circuit elements 70. Each of the housing apertures 74 generally corresponds to the size and shape of the contact assembly base 12, but is somewhat larger to allow the base 12 to shift within the aperture 74, as explained below in greater detail. In the illustrated embodiment, the housing 68 includes ten apertures 74 arranged in a row to receive ten contact assemblies 10a-j. It will be appreciated by those skilled in the art that the connector 64 may include virtually any number of contact assemblies arranged in any of various patterns according to the requirements of the particular implementation without departing from the spirit or scope of the present invention. By way of example, the contact assemblies may be arranged in multiple rows or in a circular pattern in the housing 68.

The housing 68 is made of a rigid material and is fixedly secured to the circuit board 66. The housing 68 may present an external shape configured to mate with an external connector such that one or more connector elements each engage one of the contact assemblies 10. The housing 68 includes a pair of retention recesses 76 associated with each aperture 74 and configured to engage the retention tabs 44, 46 of the contact assembly 10 positioned in the aperture 74.

As mentioned above, each of the housing apertures 74 is larger than the corresponding contact assembly 10 positioned within the aperture 74 such that the contact assembly 10 can shift within the aperture 74 to at least partially self-align with the connector element 42 if the element 42 is not initially aligned with the through-hole 40. Each of the housing apertures 74 presents a cross section that is similar in shape to the oblong cross section of the contact assembly base 12 but with a greater length and width. The length and width of the housing aperture 74 cross section may each be between about 1% and about 50% greater than the corresponding length and width of the cross section of the base 12, and, more preferably, may be between about 10% and about 40% greater. The cross section of the aperture 74 may particularly be about 10%, about 15%, about 20%, about 25%, about 30%, about 35% or about 40% larger than the cross section base 12.

The particular dimensions and proportions of the contact assembly 10 and the connector 64 may vary substantially from one embodiment of the invention to another without departing from the spirit or scope of the invention. Therefore, it will be understood that any discussion herein relating to particular dimensions or proportions of the contact assembly 10, any of its components or the connector 64 pertain to one or more exemplary embodiments and are not limiting in nature. In various exemplary embodiments of the invention, each of the electrical contacts 14, 16 may be between 0.2 inches and 1.0 inches in length and may particularly be about 0.5 inches, 0.6 inches or 0.7 inches long. The diameter of each of the electrical contacts 14, 16 is less than about 0.1 inches and may particularly be about 0.01 inches, about 0.04 inches or about 0.07 inches. The electrical contacts 14, 16 are separated by a distance of less than about 0.2 inches, and, more particularly, may be separated by a distance of less than about 0.15 inches. The separation distance between the electrical contacts 14, 16 may particularly be about 0.01 inches, about 0.05 inches, about 0.1 inches or about 0.12 inches.

It will be appreciated by those skilled in the art that if the separation distance between the electrical contacts 14, 16 is too large, the connector element 42 may slide between the contacts 14, 16. If the separation distance between the electrical contacts 14, 16 is too small, the contacts 14, 16 may make physical contact with each other during use. In some embodiments, about ten to forty percent of the diameter of the connector element 42 is contacted by the electrical contacts 14, 16.

The diameter of the through-hole 40 will typically correspond to the overall diameter of the contact element 42 plus space for any allowable movement of the connector element 42 in the assembly 10. The through-hole 40 thus constrains movement of the connector element 42 and guides it to be approximately centered between the electrical contacts 14,16 while allowing for some variance in the position of the connector element 42 to accommodate, for example, a bent or misaligned connector element.

In some embodiments, the diameter of the mouth 38 may be approximately two to five times the diameter of the through-hole 40, and may be larger depending on the overall alignment characteristics of the assembly. More particularly, the diameter of the mouth 38 of the narrowing aperture 36 may be within the range of from about 0.2 inches to about 0.6 inches, and may particularly be about 0.3 inches, about 0.4 inches or about 0.5 inches. The diameter of the through-hole 40 may be within the range of from about 0.05 inches to about 0.2 inches and may particularly be about 0.08 inches, about 0.1 inches, about 0.12 inches or about 0.15 inches. The separation distance between a center of each of the contact assemblies 10a-j in the connector 64 may be about 0.8 inches, about 0.1 inches or about 0.12 inches.

The connector 64 may be assembled by first placing a contact assembly 10 in each of the housing apertures 74. Each contact assembly 10 is inserted into the contact assembly 10 through the bottom of the corresponding aperture 74 (the end of the aperture adjacent the circuit board 66 in FIG. 4) and sliding the assembly 10 into the aperture 74 until the retention tabs 44, 46 are seated in the retention recesses 76. With all of the contact assemblies 10a-j in the housing 68, the housing 68 is mounted on the circuit board 66 and secured in place using fasteners such as screws or an adhesive. As explained above, the housing 68 is positioned on the circuit board 66 such that the electrical contacts 14, 16 of each of the contact assemblies 10a-j engage a pair of circuit elements 70 on the circuit board 66.

In operation, an external connector may be coupled with the connector 64 by physically mating a housing of the external connector with the housing 68 by, for example, sliding the external connector housing into engagement with the housing 68. As the external connector moves into engagement with the connector 64, a plurality of pins or other connector elements 42a-j move into the narrowing apertures 36 of the contact assemblies and into engagement with the electrical contacts 14, 16 of each of the contact assemblies 10a-j. After the connector element 42 makes initial contact with the electrical contacts 14, 16, further inward movement of the connector element 42 causes the electrical contacts 14, 16 to compress by pushing the second segment 52 of each of the electrical contacts 14, 16 inward against the spring element 54, which yields to the inward pressure and urges the second segment 52 outward against the connector element 42.

In the illustrated embodiment, the connector 64 is configured to mate with an external connector presenting a linear array of pins. It is common for one or more of the pins in such an array to be bent or otherwise out of position. The connector 64 is especially adapted to accommodate such variations in pin position in that each of the contact assemblies 10a-j is configured to make alignment corrections independently of the other contact assemblies.

Each contact assembly 10a-j is operable to make alignment corrections in at least two ways, as most clearly illustrated in FIG. 6. First, the narrowing aperture 36 of the contact assembly base 12 guides a corresponding connector element 42—in this case a conductive pin—into alignment with the electrical contacts 14, 16. A pin that is not properly aligned with the electrical contacts 14, 16 would be guided into the through-hole 40 by the narrowing aperture 36 as the pin is forced into the contact assembly 10. Second, the contact assembly 10 is operable to shift within the housing 68 and into alignment with the pin. Each contact assembly 10a-j is retained in the respective housing aperture 74 by the retention tabs 44, 46 which engage the retention recesses 76. The retention recesses 76—as well as the entire housing aperture 74—are somewhat larger than the contact assembly base 12 such that the base 12 can shift within the housing aperture 74. The contact assembly 10 of FIG. 6 is illustrated in a shifted position within the housing aperture 74. Each of the contact assemblies 10a-j can shift in any lateral direction within the housing aperture 74. Both the narrowing aperture 36 and the shifting function of the contact assemblies 10a-j operate to correct alignment in any lateral direction, that is, forward, backward, left, right or a combination thereof. In other words, the second end 20 of the assembly 10 can move in any direction generally within a plane that is perpendicular to a longitudinal axis of each of the electrical contacts 14, 16.

It should be noted that the contact assembly 10 is not rigidly secured to the circuit board 66 or the housing 68, but is "loosely" held in place by the retention tabs 44, 46. However, movement of the contact assembly 10 is sufficiently confined that the first segment 50 of each of the electrical contacts 14, 16 is always align with the respective metal pad on the circuit board 66. The spring element 54 biases the first segments outwardly and into contact with the circuit elements 70 such that there is always an electrical connection between electrical contacts 14, 16 and the circuit elements 70 regardless of the position of the contact assembly 10.

Although the invention has been described with reference to the exemplary embodiments illustrated in the attached drawings, it is noted that equivalents may be employed and substitutions made herein without departing from the scope of the invention as recited in the claims. For example, in some embodiments the sleeve 48 may be entirely omitted from the assembly 10 wherein the first segment 50, second segment 52 and spring element 54 of each contact 14, 16 are configured to engage the walls of the boreholes 30, 32. Furthermore, the tip 62 may present a chamfered outer surface (as illustrated), or may present a conical or similar shape.

Having thus described various embodiments of the invention, what is claimed as new and desired to be protected by Letters Patent includes the following:

1. A contact assembly comprising:
   a base formed at least partially of an electrically nonconductive material;
   a first electrical contact supported by the base, a first end of the first electrical contact corresponding to a first end of the base and configured to engage a first external conductive circuit element;
   a second electrical contact supported by the base, a first end of the second electrical contact corresponding to the first end of the base and configured to engage a second external conductive circuit element;
   the first contact and the second contact being electrically isolated from one another, each contact being configured to compress when engaging an external connector element,
   the base including:
      an aperture positioned on a second end of the base outboard of a second end of the first and second electrical contacts, the aperture presenting a narrowing shape with a wide mouth distal the electrical contacts and a narrow internal through-hole proximate the electrical contacts; and
      a retention tab for engaging a corresponding retention recess of a housing and for preventing the contact assembly from separating from the conductive circuit element and the housing, the retention tab being configured to shift within the retention recess thereby allowing the base to shift within the housing.

2. The contact assembly of claim 1, the aperture being positioned such that a center of the aperture corresponds to a portion of the base between the contacts.

3. The contact assembly of claim 1, the first electrical contact and the second electrical contact each including—
   a first contact segment corresponding to the first end of the contact, and a second contact segment corresponding to the second end of the contact, the first contact segment and the second contact segment being slidably disposed in the base and separated by a spring element configured to bias the contact segments away from one another and towards the ends of the base.

4. The contact assembly of claim 3, a portion of the first contact segment of each electrical contact extending beyond the first end of the base.

5. The contact assembly of claim 4, the first contact segment of each electrical contact presenting a rounded tip surface.

6. The contact assembly of claim 5, the second contact segment of each electrical contact presenting a chamfered tip surface.

7. The contact assembly of claim 1, the first electrical contact and the second electrical contact each including— a cylindrical sleeve fixedly disposed in the base, and first and second contact segments slidably disposed in opposing ends of the sleeve, the first contact segment and the second contact segment being separated by a spring element configured to bias the segments away from one another and toward the ends of the base.

8. The contact assembly of claim 7, the first segment of each electrical contact corresponding to the first end of the electrical contact and configured to retract when engaging one of the external conductive circuit elements, and the second segment of each electrical contact corresponding to a second end of the electrical contact and configured to retract when engaging the external connector element.

9. The contact assembly of claim 1, the through-hole presenting a diameter of less than 0.2 inches, and the first electrical contact and the second electrical contact being separated by a distance of less than 0.15 inches.

10. The contact assembly of claim 1, the first electrical contact and the second electrical contact each being between 0.2 inches and 1.0 inches long.

11. The contact assembly of claim 1, the base, the first electrical contact and the second electrical contact being configured such that the first electrical contact and the second electrical contact simultaneously engage the external connector element at different points on the connector element when the external connector element is inserted through the aperture.

12. A connector comprising:

a circuit board including a plurality of conductive pads arranged in pairs, each pair of pads comprising a first conductive pad and a second conductive pad;

a housing secured to the circuit board and including a plurality of apertures; and a plurality of contact assemblies, each of the contact assemblies being positioned in one of the apertures of the housing and configured to shift within the housing, each of the contact assemblies being configured to engage one of the pairs of conductive pads, each of the contact assemblies including— a base formed at least partially of an electrically non-conductive material and including a retention tab for engaging a corresponding retention recess in the housing and preventing the contact assembly from separating from the circuit board and the housing, the retention tab being smaller than the retention recess such that the retention tab can shift within the retention recess thereby allowing the base to shift within the housing;

a first electrical contact supported by the base and configured to engage a first conductive pad;

a second electrical contact supported by the base and configured to engage a second conductive pad;

the first contact and the second contact being electrically isolated from one another and configured to compress when engaging an external connector element, the base including an aperture positioned on an end of the base opposite the circuit board, the aperture being positioned outboard of the first and second electrical contacts and presenting a narrowing shape with a wide mouth distal the electrical contacts and a narrow internal through-hole proximate the electrical contacts.

13. The contact assembly of claim 12, the first electrical contact and the second electrical contact each including— a first contact segment corresponding to a first end of the contact proximate the circuit board, and a second contact segment corresponding to a second end of the contact distal the circuit board, the first contact segment and the second contact segment being slidably disposed in the base and separated by a spring element configured to bias the contact segments away from one another.

14. The contact assembly of claim 13, the first segment of each electrical contact configured to retract when engaging one of the external conductive circuit elements, and the second segment of each electrical contact configured to retract when engaging the external connector element.

15. The contact assembly of claim 13, the first contact segment of each electrical contact including a first end engaging one of the conductive pads and presenting a rounded tip surface.

16. The contact assembly of claim 13, the second contact segment of each electrical contact including a first end proximate the aperture of the base and presenting a chamfered tip surface.

17. The contact assembly of claim 12, the through-hole of each of the contact assemblies presenting a diameter of less than 0.2 inches, and the first electrical contact and the second electrical contact being separated by a distance of less than 0.15 inches.

18. The contact assembly of claim 12, the first electrical contact and the second electrical contact each being between 0.2 inches and 1.0 inches long.

19. The contact assembly of claim 12, each of the contact assemblies being configured such that the first electrical contact and the second electrical contact simultaneously engage the external connector element at different points on the connector element when the external connector element is inserted through the aperture.

* * * * *